(12) United States Patent
Martinez Weber

(10) Patent No.: US 10,619,834 B2
(45) Date of Patent: Apr. 14, 2020

(54) LIGHTING SYSTEM

(71) Applicant: Antares Iluminacion, S.A.U., Valencia (ES)

(72) Inventor: Federico Martinez Weber, Valencia (ES)

(73) Assignee: ANTARES ILUMINACION, S.A.U., Valencia (ES)

(*) Notice: Subject to any disclaimer, the term of this patent is extended or adjusted under 35 U.S.C. 154(b) by 112 days.

(21) Appl. No.: 15/742,635

(22) PCT Filed: Jul. 8, 2015

(86) PCT No.: PCT/ES2015/070531
§ 371 (c)(1),
(2) Date: Jan. 8, 2018

(87) PCT Pub. No.: WO2017/005943
PCT Pub. Date: Jan. 12, 2017

(65) Prior Publication Data
US 2018/0202642 A1    Jul. 19, 2018

(51) Int. Cl.
| | | |
|---|---|---|
| F21S 8/06 | (2006.01) | |
| F21V 23/06 | (2006.01) | |
| F21V 17/10 | (2006.01) | |
| F21V 19/00 | (2006.01) | |
| F21S 4/28 | (2016.01) | |
| F21S 8/02 | (2006.01) | |
| H05K 3/24 | (2006.01) | |
| F21S 8/00 | (2006.01) | |
| F21V 21/005 | (2006.01) | |
| F21V 21/088 | (2006.01) | |
| F21V 21/35 | (2006.01) | |
| F21V 23/00 | (2015.01) | |
| H05B 33/08 | (2020.01) | |
| F21Y 115/10 | (2016.01) | |
| F21Y 103/10 | (2016.01) | |
| F21Y 101/00 | (2016.01) | |

(52) U.S. Cl.
CPC ............... *F21V 23/06* (2013.01); *F21S 4/28* (2016.01); *F21S 8/022* (2013.01); *F21S 8/026* (2013.01); *F21S 8/038* (2013.01); *F21S 8/066* (2013.01); *F21V 17/105* (2013.01); *F21V 19/004* (2013.01); *F21V 21/005* (2013.01); *F21V 21/088* (2013.01); *F21V 21/35* (2013.01); *F21V 23/001* (2013.01); *H05B 33/0845* (2013.01); *H05K 3/246* (2013.01); *F21Y 2101/00* (2013.01); *F21Y 2103/10* (2016.08); *F21Y 2115/10* (2016.08); *H05K 2201/0323* (2013.01)

(58) Field of Classification Search
CPC ......... F21S 8/038; F21S 8/066; F21V 21/005; F21V 21/35; F21V 23/06
See application file for complete search history.

(56) References Cited

FOREIGN PATENT DOCUMENTS

| | | | |
|---|---|---|---|
| DE | 4114701 A1 | 11/1992 | |
| EP | 2657590 A1 | 10/2013 | |
| EP | 2657590 A1 * | 10/2013 | ............... F21S 8/02 |

* cited by examiner

*Primary Examiner* — Sean P Gramling
(74) *Attorney, Agent, or Firm* — Hayes Soloway PC

(57) ABSTRACT

The present invention relates to a lighting system that enhances installation conditions, avoiding risks therein and during operation of the system over time, and which facilitates insertion of the electrical contacts of the functional unit and allows its concealment without modifying the conductive properties thereof.

20 Claims, 5 Drawing Sheets

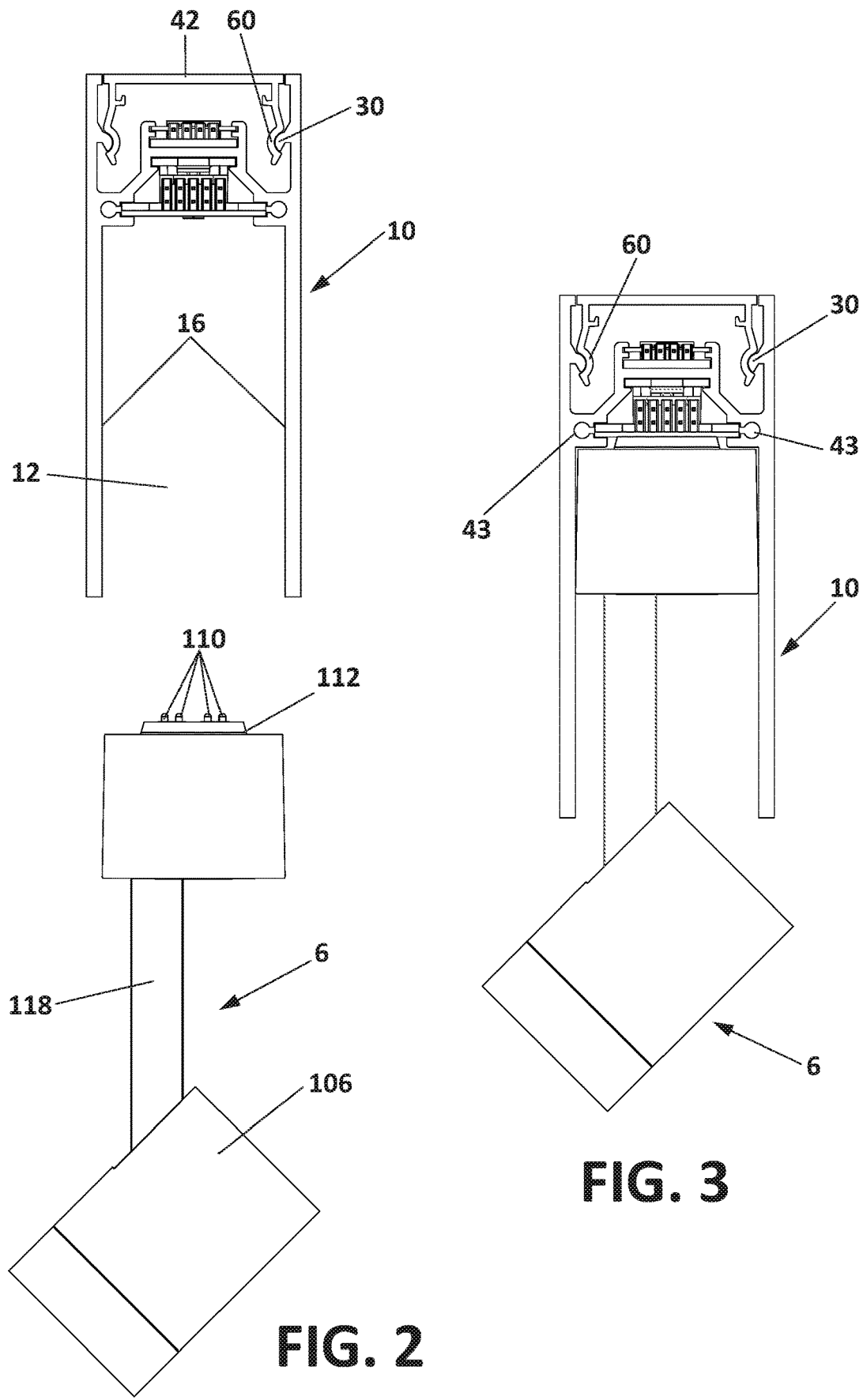

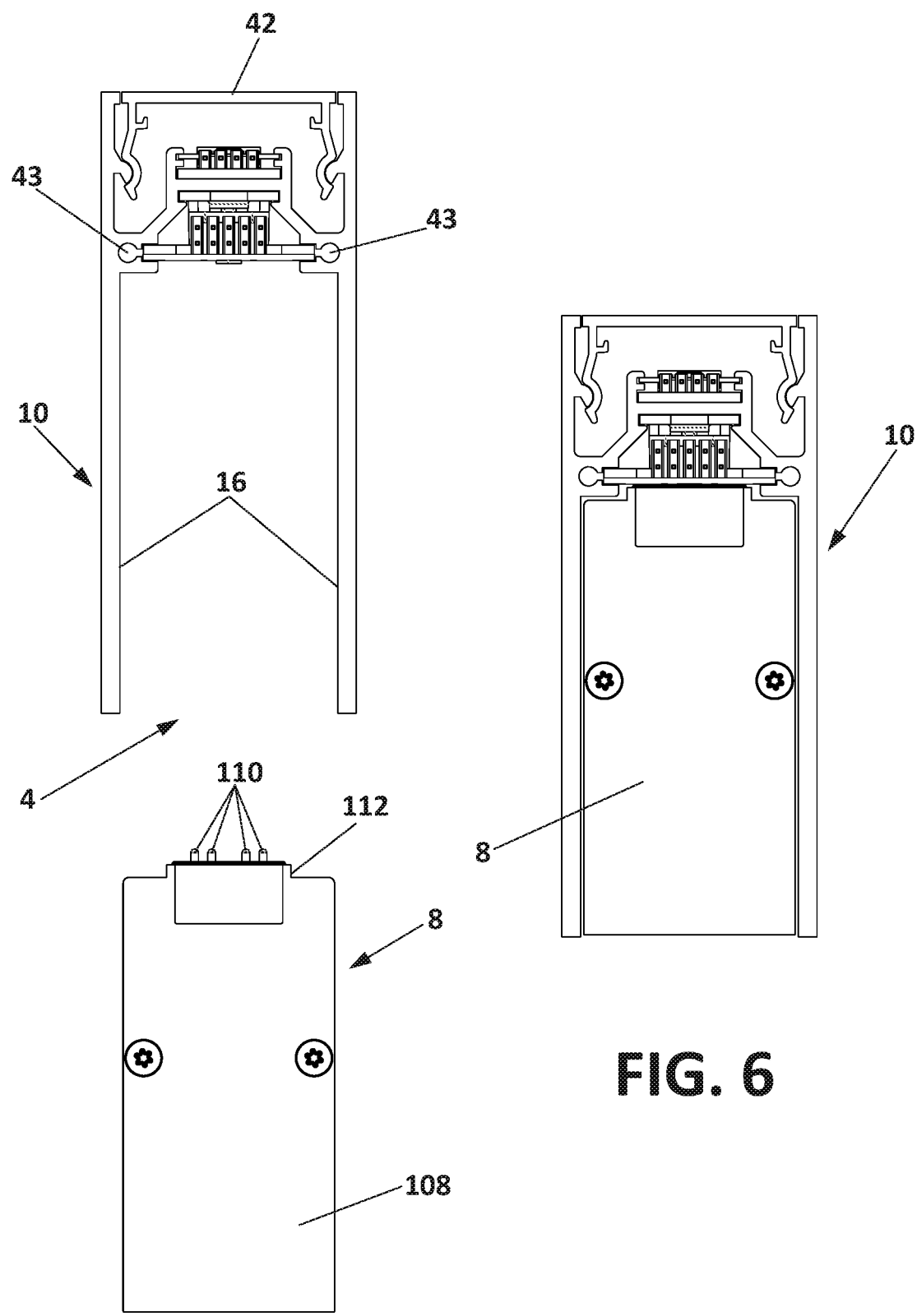

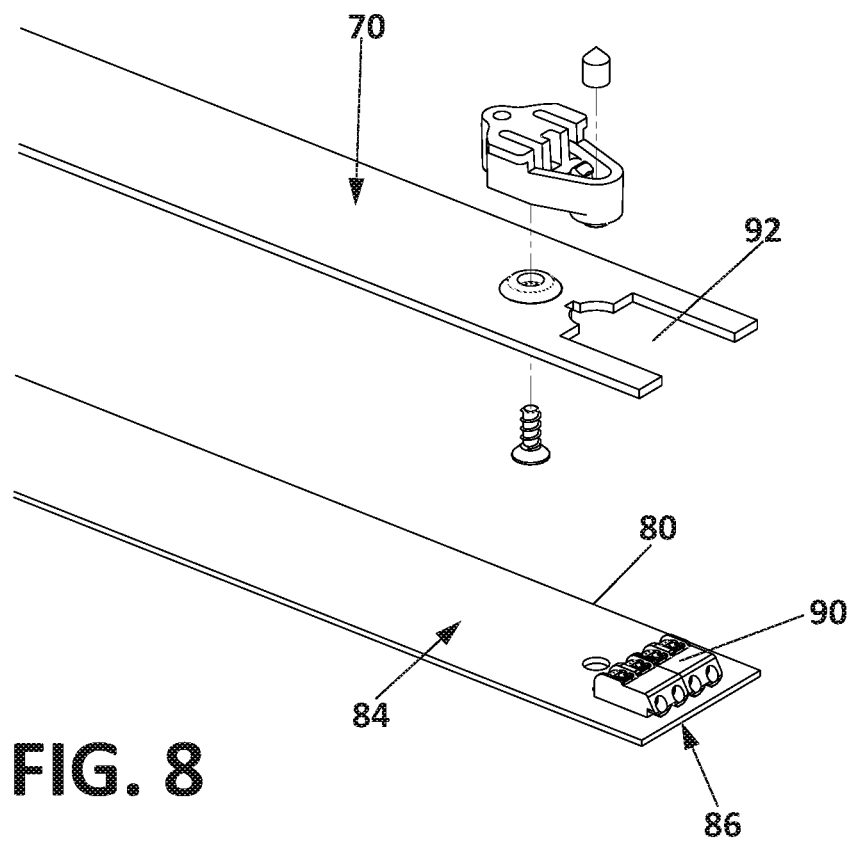
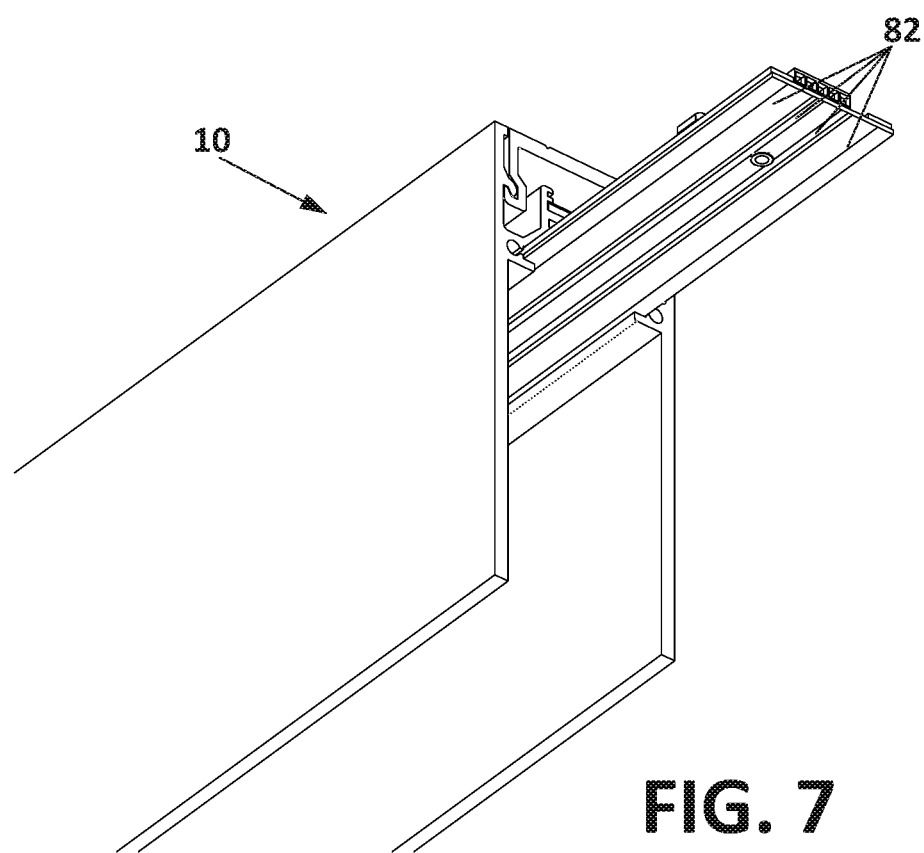

LIGHTING SYSTEM

OBJECT OF THE INVENTION

The present invention relates to a lighting system that enhances installation conditions, avoiding risks therein and during operation of the system over time.

The object of the present invention is a lighting system that facilitates the insertion of the electrical contacts of the functional unit and allows its concealment without modifying the conductive properties thereof.

BACKGROUND OF THE INVENTION

The prior art discloses lighting systems that allow carrying out the integration of lighting devices in hollows inside walls, ceilings or floors.

These systems comprise a support structure extending in a longitudinal direction and forming an internal space accessible from an opening, at least one functional unit capable of being housed in the internal space of the support structure, provided with a lower surface in which electrical contacts are embodied and at least one lighting device provided with lighting means and comprising electrical contacts coupled to the electrical contacts of the functional unit to maintain the lighting device connected to the functional unit.

The above systems have the disadvantage that it is necessary to arrange the functional unit within a support profile which must then be introduced vertically into a support structure to carry out the coupling of the functional unit within the support structure.

In prior systems neither is it possible to carry out the insertion of the functional unit in the longitudinal direction of the support structure due to the structure thereof.

The present invention overcomes all the above drawbacks preventing sparks at the moment of the coupling of the functional unit to the support structure, while said coupling is also facilitated.

DESCRIPTION OF THE INVENTION

The present invention relates to a lighting system which can be coupled to the ceiling, wall or floor of a room in which it is arranged.

The lighting system comprises a lighting device which is movable from a position where all or part is housed inside a support structure to a position in which it is partly housed in or it totally protrudes from the support structure respectively.

The lighting system comprises:
  A support structure extending in a longitudinal direction and forming an internal space;
  At least one functional unit extending in a longitudinal direction which can be accommodated in the internal space of the support structure, provided with a lower surface comprising electrical contacts;
  At least one lighting device provided with lighting means and comprising electrical contacts which can be coupled to the electrical contacts of the functional unit to maintain the lighting device connected to the functional unit, wherein the lower surface of the functional unit comprises a coating of screen-printed graphite.

Thus sparks are prevented at the moment in which the coupling of the functional unit to the support structure takes place, while said coupling is also facilitated. In addition, the electrical contacts of the functional unit are hidden and are not visible to an observer as they are hidden by coating of screen-printed graphite.

Furthermore, since the graphite is a low friction material, this facilitates the sliding of the lighting device on the contacts of the functional unit avoiding sparking.

Preferably the screen-printed graphite coating is presented in 49-77 T/cm monofilament meshes, with a typical printing thickness of 11 to 18 μm.

Moreover, the lighting device comprises magnetic means adapted to be magnetically coupled with magnetic means of the functional unit to maintain the lighting device attached to said functional unit.

The lighting devices can be moved along the longitudinal direction of the functional unit, since the electrical contacts of each lighting device are in contact with the electrical contacts of the functional unit.

The functional unit comprises an electrical connector which can be connected to a power cable for electrical connection of several functional units, to control means of LED modules or to the power grid.

BRIEF DESCRIPTION OF THE DRAWINGS

FIG. 2 shows an elevational view of FIG. 1.

FIG. 3 shows a view of FIG. 2 wherein the lighting device is in its operating position.

FIG. 5 shows an elevational view of FIG. 4.

FIG. 6 shows a view of FIG. 5 wherein the lighting device is in its operating position.

FIG. 7 shows a perspective view of the functional unit being inserted into the support structure.

FIG. 8 shows an exploded view of the functional unit of the lighting system of the present invention.

PREFERRED EMBODIMENT OF THE INVENTION

Figure 1:
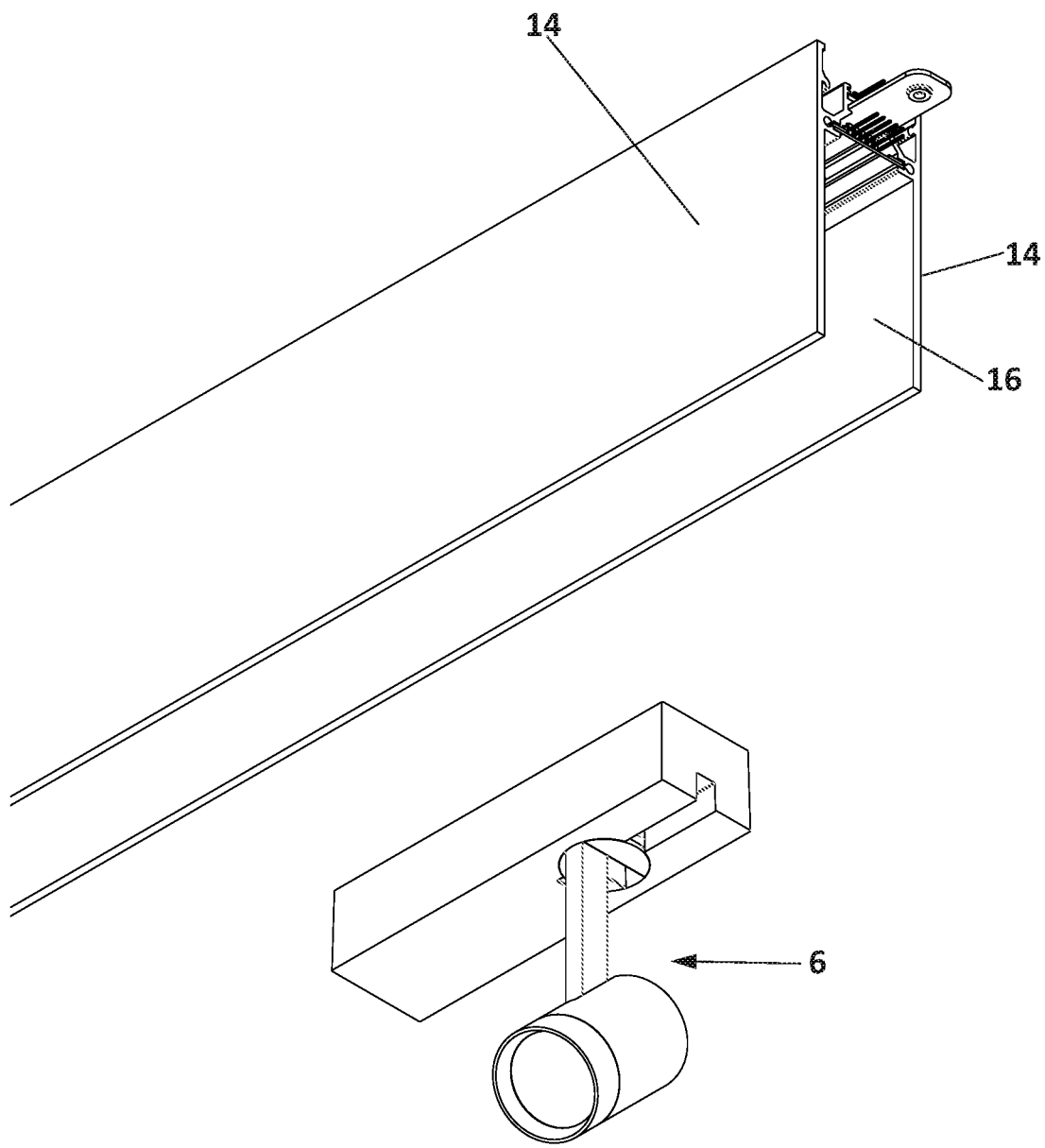
FIG. 1 shows a perspective view of the lighting system of the present invention depicting a first example of the lighting device shown outside the lighting system.

Below is a detailed description of the lighting system of the present invention.

The lighting system comprises a lighting device (6, 8) which can be totally housed inside a support structure (10), it can protrude partially or totally from the same (10) or be telescopic so that it is movable from a position in which it is totally or partially housed inside the support (10) structure to a position in which it is partially housed in or totally protrudes from the support (10) structure respectively.

The support structure (10) of the lighting system is preferably extruded, for example aluminium, which extends in a longitudinal direction (X) and forms an internal space (12) accessible from an opening (4) of said support structure (10).

Preferably, the support structure (10) has an inverted U-shape and comprises two side walls (14) facing each other defining two internal side surfaces (16), preferably flat and parallel, and a rear wall, connecting the two side walls (14) facing each other and closes the internal space (12) at the top.

Furthermore, the support structure (10) comprises internal ribs (30) projecting from the side walls (14) into the internal space (12). These internal ribs (30) contribute with clips (60)

which allow to carry out the coupling of a top cover (42) permitting securing said top cover (42) to the ceiling, floor or wall of the room and the subsequent coupling of the support structure (10) by coupling the internal ribs (30) with the clips (60).

The apparatus further comprises a functional unit (40) which can be coupled to the support structure (10) which is arranged completely in the interior (12) of said support structure (10) by longitudinal displacement of said functional unit through slots (43) present on the support structure (10).

The functional unit (40) further comprises magnetic means suitable to interact magnetically, as will be described later. Preferably said fixed magnetic means comprise a sheet (70) made of metal material, engageable in the slots (43) present in the support structure (10).

Furthermore, the functional unit (40) comprises a support sheet (80) of an electrical connection, housed in the slots (43) present in the support structure (10), wherein said support sheet (80) comprises electrical contacts (82) extending along its longitudinal direction.

Preferably, the support sheet (80) of the electrical connection comprises a strip (84) of insulating material, for example silicon, provided with a lower surface (86) in which electrical contacts (82) are embodied, preferably being four, extending along its longitudinal direction. Two electrical contacts (82) are used to carry the current and two electrical contacts (82) are used to regulate the light intensity of lighting means (106, 108) to be described later.

The support sheet (80) of the electrical connection further comprises at least one electrical connector (90), arranged for example in the strip (84) of insulating material on the opposite side of the lower surface (86).

Furthermore, the sheet (70) of metal material which acts as magnetic means is preferably provided with an opening (92), wherein the electrical connector (90) of the support sheet (80) of the electrical connection can be inserted.

Furthermore, the strip (84) of insulating material is in contact with the sheet (70) of metal material, and in particular so that the lower surface (86) of said strip (84) delimits the internal space (12) of the support structure (10) when coupling the functional unit (40) in the support structure (10).

The electrical connector (90) of the support sheet (80) of the electrical connection can be connected to a power cable for electrical connection of several functional units (40) to a control means of LED modules or to the power grid.

The lighting system of the present invention further comprises a lighting device (6, 8) which can be coupled magnetically to the functional unit (40) establishing at the same time an electrical connection with the electrical contacts (82) extending along the longitudinal direction of the support sheet (80) of the functional unit (40).

In a first example of the lighting device shown in FIGS. 1 to 3, the lighting device (6) comprises a housing (100) defining therein a space for housing a printed circuit (not shown) the housing (100) being connected to lighting means (106), for example LED modules, for example by means of a telescopic system (118).

Figure 4:
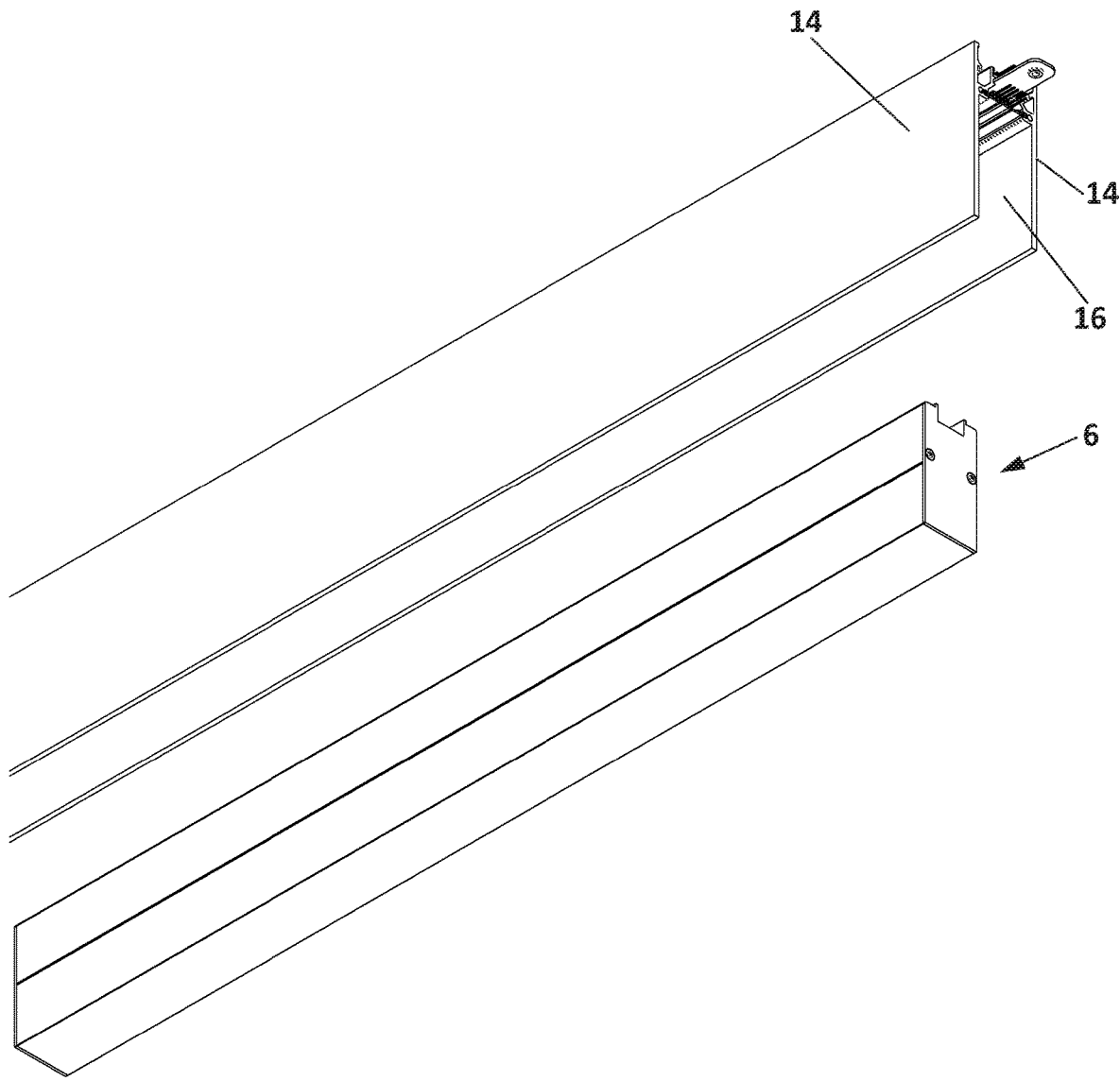
FIG. 4 shows a perspective view of the lighting system of the present invention wherein a second embodiment of the lighting device is shown outside the lighting system.

In a second example of the lighting device shown in FIGS. 4 to 6, the lighting device (8) comprises a housing (100) defining therein a space for housing a printed circuit (not shown) the housing (100) being connected to lighting means (108) for example halogen lamps.

Moreover, the lighting device (6, 8) comprises magnetic means adapted to couple magnetically with the magnetic means of the functional unit (40) to maintain the lighting device (6, 8) connected to said functional unit (40). Preferably said magnetic means of the lighting device (6, 8) comprises a permanent magnet (not shown) located in the interior space of the housing (100).

Furthermore, the lighting device (6, 8) comprises electrical contacts (110) mounted on an electronic board (112) fixed to the housing (100) and capable of being slidably coupled with the electrical contacts (82) of the functional unit (40).

One or more lighting devices (6, 8) are inserted into the support structure (10), connecting to the functional unit (40) due to magnetic coupling between the magnetic means of each lighting device (6, 8) and magnetic means of the functional unit (40), while the electrical contacts (110) of the lighting devices (6, 8) make electrical contact with the electrical contacts (82) of the functional unit (40).

The lighting devices (6, 8) can be displaced along the longitudinal direction of the functional unit (40), since the electrical contacts (110) of each lighting device (6, 8) are in contact with electrical contacts (82) of the functional unit (40).

Therefore, it is possible to position the light fixtures (6, 8) at will along the support structure (10).

According to an alternative embodiment to the lighting devices (6) provided with a telescopic system (118), it is possible to arrange the lighting means (106) outside from the internal space (12) of the support structure (10) once having coupled the functional unit (40) to the support structure (10).

The invention claimed is:

1. Lighting system for walls, ceilings or floors comprising:
    a support structure extending in a longitudinal direction and forming an internal space;
    at least one functional unit extending in a longitudinal direction which can be accommodated in the internal space of the support structure, provided with a lower surface comprising electrical contacts;
    at least one lighting device provided with lighting means and comprising electrical contacts coupled to the electrical contacts of the functional unit to maintain the lighting device connected to the functional unit;
    wherein the lower surface of the functional unit comprises a screen-printed graphite coating which hides the electrical contacts of the lower surface of the functional unit, wherein the electrical contacts of the at least one lighting device are slidable on the screen-printed graphite coating.

2. The system of claim 1 wherein the screen-printed graphite coating is presented in 49-77 T/cm monofilament meshes, with a typical printing thickness of 11 to 18 μm.

3. The system of claim 1 wherein the lighting device comprises magnetic means adapted to be magnetically coupled with magnetic means of the functional unit.

4. The system of claim 1 wherein the lighting device is displaceable along the longitudinal direction of the functional unit.

5. The system of claim 1 wherein the functional unit comprises an electrical connection comprising an electrical connector connectable to a power cable for electrical connection of various functional units, to control means of LED modules, or to the power grid.

6. The system of claim 3 wherein the magnetic means of the functional unit comprises a sheet of metal material engageable in slots present on the support structure.

7. The system of claim 6 wherein the functional unit comprises a support sheet of the electrical connection housed in slots present in the support structure.

8. The system of claim 7 wherein the support sheet of the electrical connection comprises a strip of insulating material in which the lower surface is arranged in which the electrical contacts are arranged.

9. The system of claim 8 wherein the electrical connector is arranged on the strip of insulating material on the opposite side of the lower surface.

10. The system of claim 9 wherein the sheet of metal material comprises an opening in which the electrical connector of the support sheet of the electrical connection is housed.

11. The system of claim 1 wherein the support structure comprises internal ribs projecting from side walls of said support structure into the internal space, wherein the internal ribs allow to perform the coupling of a top cover which comprises clips with said internal ribs permitting securing said top cover to the ceiling, floor or wall of the room.

12. The system of claim 1 wherein the electrical contacts of the functional unit are four wherein two of the electrical contacts are used to carry the current and two electrical contacts are used to regulate the light intensity of the lighting means.

13. The system of claim 3 wherein the lighting device is displaceable along the longitudinal direction of the functional unit.

14. The system of claim 3 wherein the functional unit comprises an electrical connection comprising an electrical connector connectable to a power cable for electrical connection of various functional units, to control means of LED modules, or to the power grid.

15. The system of claim 4 wherein the functional unit comprises an electrical connection comprising an electrical connector connectable to a power cable for electrical connection of various functional units, to control means of LED modules, or to the power grid.

16. The system of claim 4 wherein the magnetic means of the functional unit comprises a sheet of metal material engageable in slots present on the support structure.

17. The system of claim 5 wherein the magnetic means of the functional unit comprises a sheet of metal material engageable in slots present on the support structure.

18. The system of claim 17 wherein the functional unit comprises a support sheet of the electrical connection housed in slots present in the support structure.

19. The system of claim 18 wherein the support sheet of the electrical connection comprises a strip of insulating material in which the lower surface is arranged in which the electrical contacts are arranged.

20. The system of claim 19 wherein the electrical connector is arranged on the strip of insulating material on the opposite side of the lower surface.

* * * * *